United States Patent [19]

Hiss et al.

[11] 4,341,571
[45] Jul. 27, 1982

[54] METHOD OF MAKING PLANAR DEVICES BY DIRECT IMPLANTATION INTO SUBSTRATE USING PHOTORESIST MASK

[75] Inventors: Ludwig Hiss, Endingen; Ulrich Waldvogel, Sexau, both of Fed. Rep. of Germany

[73] Assignee: ITT Industries, Inc., New York, N.Y.

[21] Appl. No.: 201,884

[22] Filed: Oct. 29, 1980

[30] Foreign Application Priority Data

Nov. 13, 1979 [DE] Fed. Rep. of Germany ....... 2945854

[51] Int. Cl.³ .................... H01L 21/26; H01L 21/265
[52] U.S. Cl. .................................... 148/1.5; 148/187; 156/643; 357/91; 427/43.1
[58] Field of Search ............... 148/1.5, 187; 357/91, 357/23; 156/643; 427/43.1

[56] References Cited

U.S. PATENT DOCUMENTS

| | | | |
|---|---|---|---|
| 3,920,483 | 11/1975 | Johnson, Jr. et al. | 148/1.5 |
| 3,951,694 | 4/1976 | Monfret | 148/1.5 |
| 4,004,044 | 1/1977 | Franco et al. | 427/43.1 |
| 4,133,704 | 1/1979 | MacIver et al. | 148/187 |
| 4,201,800 | 5/1980 | Alcorn et al. | 148/187 |
| 4,209,356 | 6/1980 | Stein | 156/643 |
| 4,244,799 | 1/1981 | Fraser et al. | 156/643 |
| 4,253,888 | 3/1981 | Kikuchi | 148/187 |
| 4,275,286 | 6/1981 | Hackett, Jr. | 156/643 |

OTHER PUBLICATIONS

Moran et al., J. Vac. Sci. Technol., 16 (Nov.-Dec. 1979), 1620-1624.
Dearnaley et al., (eds.), Ion Implantation, North Holland, N.Y., 1973, pp. 503-507, 510, 511.

*Primary Examiner*—Upendra Roy
*Attorney, Agent, or Firm*—John T. O'Halloran; David M. Quinlan

[57] ABSTRACT

An ion implantation process uses exclusively photoresist masks to cover a substrate except in the regions to be implanted with ions. The photoresist masks are removed after each ion implantation by plasma etching.

2 Claims, 5 Drawing Figures

METHOD OF MAKING PLANAR DEVICES BY DIRECT IMPLANTATION INTO SUBSTRATE USING PHOTORESIST MASK

BACKGROUND OF THE INVENTION

The invention relates to an ion implantation process.

According to one such process, as is known from "Solid-State Electronics" (1972) Vol. 15, pp. 165 to 175, a substrate region arranged superficially in a semiconductor body, and by employing an oxide mask produced photolithographically with the aid of a resist mask, is produced by the implantation of ions which are subsequently diffused deeper into the substrate region. Moreover, in this process, oxide masks are exclusively used for limiting the region areas for the ion implantation.

In processes in which the doping material is deposited upon a plurality of differently doped regions by way of ion implantation, the exclusive use of oxide masks has been customary ever since. See, for example, "IEEE Journal of Solid-State Circuits", Vol. SC 14, No. 2 (Apr. 1979), pp. 312 through 318.

The exclusive use of oxide masks has the disadvantage that after each implantation, it is necessary to form a new oxide layer, especially in the case of a following rediffusion. Although the exclusive use of oxide masks is customary, it is known from DE-AS No. 23 41 154 to use a photoresist mask for ion implantation. Of course, with this process the photoresist mask is deposited exclusively on to an insulating layer covering the substrate surface and not, even partially, on to the substrate surface.

Experts were of the opinion that photoresist masks deposited at least partially directly on to the substrate surface were not very suitable for limiting region areas during ion implantation, because the photoresist, when deposited directly on to the substrate surface, appeared unsuitable for serving as the only masking against implantation, especially in the case of higher dosages.

SUMMARY OF THE INVENTION

In the most simple and cleanest type of process according to the invention, the photoresist masks are deposited directly on to the clean substrate surface extensively freed from parts of insulating layers, such as oxide layers, and then subjected for a short period of time to a plasma oxidation process for removing used photoresist mask.

Accordingly, in the process of the invention a plasma etching operation is employed for removing the photoresist mask after each implantation step, with ions of an oxidation agent oxidizing the photoresist in the vacuum, and the oxidation products being sucked off together with other impurities. Such a cleaning process is known from the technical journal "SCP and Solid-State Technology" (Dec. 1967), pp. 33 to 38. Experience has shown that cleaning carried out in this way removes the resist masks and results without further ado in reproducible surfaces sufficiently clean for depositing further photoresist masks, for a following implantation, having good adherence properties with respect to the photoresist, and not affecting the quality of already implanted regions.

The process according to the invention is preferably used for manufacturing integrated circuits comprising a plurality of circuit components each having differently doped regions. The term differently doped regions is to be understood to mean such regions which in the doping concentration and/or as regards the conductivity type to be achieved, have different dopings. The process according to the invention, of course, may also be further developed insofar as doped areas of different strengths can be produced on the substrate surface in the same way as regions forming pn-junctions.

The process according to the invention can be used for producing bipolar as well as unipolar circuit components within monolithic integrated solid-state circuits.

BRIEF DESCRIPTION OF THE DRAWINGS

One preferred application, for manufacturing a pair of complementary insulated-gate field-effect transistors serving as the circuit portion of a monolithic integrated circuit which is mostly carried out on a semiconductor wafer to be divided into the individual integrated solid-state circuits, will now be described in greater detail with reference to the accompanying drawing the figures of which, in the usual cross sectional oblique view, illustrate the individual operating steps relating to the process according to the invention.

DESCRIPTION OF THE PREFERRED EMBODIMENTS

Figure 1:
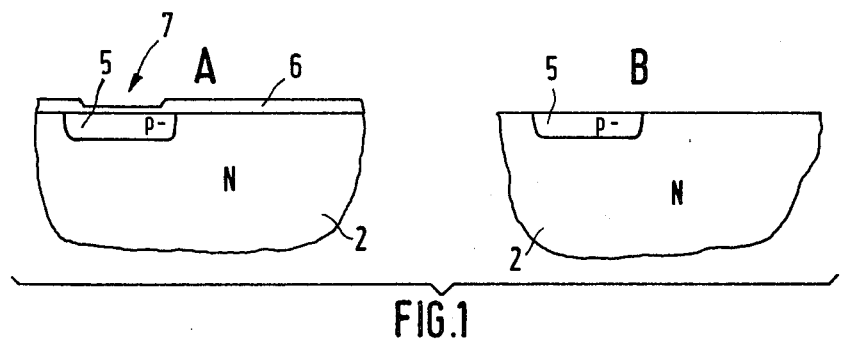
FIG. 1A shows a substrate having an oxide mask deposited thereon.
FIG. 1B shows the substrate in FIG. 1A with the oxide mask removed.

Manufacturing a monolithic integrated circuit by using pairs of circuit portions containing complementary insulated-gate field-effect transistors, and as is shown in FIGS. 1A and 1B, is started from a plate-shaped substrate 2 into the one surface side of which island-shaped planar regions 5, each forming a blocking pn-junction, are inserted for receiving the insulated-gate field-effect transistors of the one conductivity type. For this purpose, in the known manner and as is shown in FIG. 1A, the oxide masking mask 6 with the diffusion window 7 is deposited on to the substrate 2, and by using an n-doped substrate, a p-doping impurity material, preferably boron, is implanted within the diffusion window into the substrate surface in such a concentration that a weakly p-conducting planar region 5 will result subsequently to the diffusion process following the implantation process. After this, there is formed within the diffusion window 7, an oxide layer having a thickness less than that of the oxide masking mask 6, and as shown in FIG. 1A.

In accordance with the process of the invention, however, it is preferred to use a photoresist mask with a diffusion window for restricting the planar region 5, which in the same way as with the process according to the invention, by using a plasma cleaning process, is removed after the necessary amount of doping material has been brought into the surface of the substrate. Following the diffusion of the planar region 5, the substrate surface is subjected to a cleaning process, so that a plane surface will be obtained as is shown in FIG. 1B.

Figure 2:
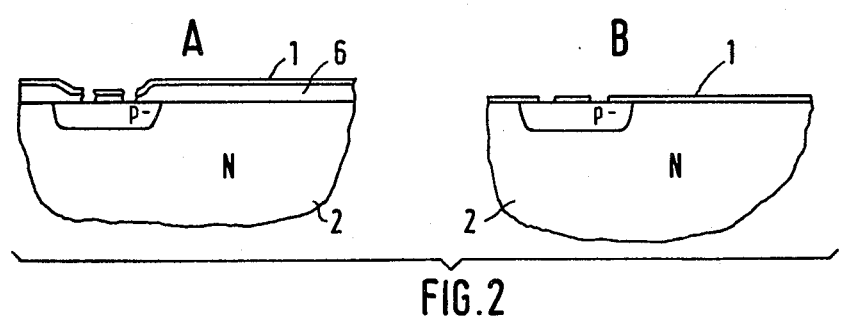
FIG. 2A shows the substrate in FIG. 1A with a first photoresist mask deposited thereon.
FIG. 2B shows the substrate in FIG. 1B with a first photoresist mask deposited thereon.

Such a plane surface is much more suitable for serving as the basis for the photoresist mask 1 as shown in FIG. 2B, deposited in accordance with the process of the invention, than the insulating layer of the oxide masking 6 which, as is shown in FIG. 2A, extends partly over the surface side of the substrate 2. In both cases A and B, the photoresist mask 1 is structured in such a way that the surfaces of the regions 11 to be manufactured, namely that of the source region and that of the drain region of the n-channel field-effect transistor, are exclusively restricted by the photoresist mask 1.

Following the implantation of phosphor atoms in an amount sufficient for the regions to be manufactured, the substrate surface is then exposed and carefully cleaned by employing an oxidizing plasma etching process, performed under conditions such that there remains only a thin oxide film which results at the end of the etching process and which is unavoidable owing to the contents of oxygen in the air.

Figure 3:
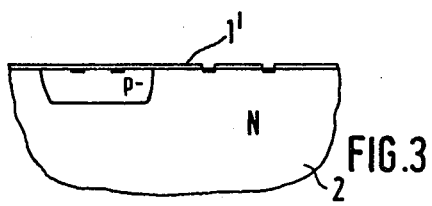
FIG. 3 shows the substrate of FIG. 2A or FIG. 2B after implantation and cleaning and with a second photoresist mask deposited thereon.

After this there is deposited in both cases the photoresist mask 1' by using a photoresist mask made in accordance with the usual photolithographic technique, comprising two openings necessary for the required regions 12, and which results in the restriction of the region areas. Thereafter the exposed surface of the substrate is irradiated through the openings in the photoresist mask 1' with a predetermined amount of p-doping impurity ions, with the surface portion of the substrate surface lying outside the areas of the regions, being masked by the photoresist mask 1'. Thereupon, the dopings for the regions of the insulated-gate field-effect transistors of different conductivity type are inserted in the substrate surface at the necessary points, as is shown in FIG. 3.

Owing to the repeated deposition of differently structured photoresist masks it is possible after each ion implantation process and the following removal of the photoresist, by employing an oxidizing plasma etching process after which remains a slightly oxidized substrate surface with very good adhering properties as regards the photoresist, to prepare any arbitrary region structures in any suitable concentration and any suitable conductivity type. After the last ion implantation, merely one single diffusion process is carried out at the relatively high temperatures which are necessary for diffusing the dopings. Since, according to experience, repeating such high-temperature processes can cause crystal damaging faults to extend over the substrate, the present invention safeguards a maximum yield lying above 90%.

Figures 4, 5:
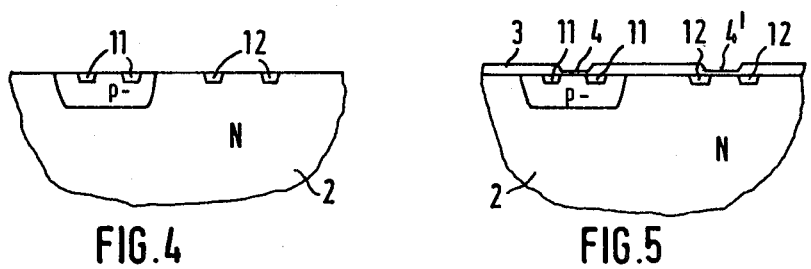
FIG. 4 shows the substrate of FIG. 3 after implantation and cleaning to remove the second mask.
FIG. 5 shows the substrate of FIG. 4 with an insulating layer deposited thereon.

Subsequently to the diffusion of the impurity atoms implanted in the form of ions, monolithic integrated solid-state circuits having structures as shown in FIG. 4 will be obtained.

With reference to FIG. 5 there will now be described a particularly advantageous further embodiment of the ion implantation process according to the invention. Following the aforementioned last ion implantation process, the surface of the substrate is covered with an insulating layer 3, preferably of silicon dioxide, which is deposited out of the gas phase, and which is resistive to the temperature at which the necessary diffusion process is carried out. Subsequently thereto, those portions of the insulating layer lying over the areas of the channel regions are removed, and the diffusion of the impurity atoms is carried out within an oxidizing atmosphere, for example, within a water-vapour atmosphere diluted with a carrier gas. In the course of this, the process parameters, in particular the composition of the oxidizing atmosphere, are chosen such that during the diffusion time required for forming the regions, the gate oxide layers 4 or 4' are formed in the necessary thickness between the regions of the region pairs. Subsequently thereto, the gate electrodes may be deposited on to these gate-oxide layers 4 or 4' respectively.

Although the process according to the invention is preferably applied to integrated solid state circuits having region structures lying laterally to each other, as is the case with solid-state circuits comprising insulated-gate field-effect transistors, its use is also possible in the case of region structures inserted into one another as is the case with monolithic integrated solid-state circuits comprising bipolar transistors. Again, with the aid of differently structured photoresist masks, and in the course of several ion implantation processes, the necessary amounts of doping material are inserted at the respective points into the surface of the substrate, with each time prior to the deposition of a new photoresist mask, the one already used being removed by way of an oxidizing plasma-etching process, and the actual diffusion process for all dopings required for producing the regions being carried out at the end. The relative penetration depths of the regions, of course, cannot be adjusted by selecting both the temperature and the time, because only one single high-temperature process is being used. By selecting the doping elements and/or the ion beam energy it is possible, however, to vary the relative penetration depths of the individual region structures within limits which are sufficient in particular for logic circuits.

The process according to the invention offers the advantage of involving a very small investment in apparatus as well as short working times, because the actual diffusion process is only carried out at the end, and the steps prior thereto are always the same operating steps of applying the photoresist, of exposing it, of releasing the photoresist material within the window of the photoresist mask, implanting different dopings, and carrying out the plasma etching process.

Considering that no masking silicon dioxide layers are used between the individual doping steps, the process according to the invention avoids in an advantageous manner a different height level from developing throughout various areas of the substrate. Apart from the contact openings, it is possible to achieve a completely plane surface to which the conductor leads are applied. This offers the added advantage that faults owing to interruptions of conductor leads at edges, are extensively avoided.

The negative photoresist ISOPOLO-MR 40D as supplied by MICRO-IMAGE TECHNOLOGY LIMITED has been successfully used in the realization of the process according to the present invention.

This photoresist is formulated from the partially cyclized isoprene family of polymers with the addition of a photo-initiator of the azide group 2.6-bis(p-azidobenzylidene)-4-methylcyclohexanone and an adhesion promoter of the silane group.

The invention has been described above by referring to specific embodiments. Those skilled in the art will recognize that the spirit of the invention encompasses embodiments other than those specifically described. The scope of the invention is intended to be defined solely by the appended claims, and not limited by the description of the preferred embodiments.

What is claimed is:

1. A method for making with a reduced failure rate a semiconductor device having a plurality of differently doped regions in a semiconductor substrate, the method comprising:

exposing a surface of said substrate by an oxidizing plasma etching operation performed under predetermined conditions wherein the oxide layer formed by said etching operation is minimized;

forming on said exposed surface a photoresist mask having at least one opening therethrough;

implanting ions in an area of said substrate through said opening;

repeating said exposing, forming and implanting steps to implant ions in a different area of said substrate; and diffusing said implanted ions only after the last said ion implantation step by heating said substrate.

2. The method recited in claim 1 wherein said differently doped regions comprise the region pairs of a plurality of insulated-gate, field-effect transistors, the method further including:

covering said surface of said substrate after removing the photoresist mask following the last said ion implantation step but before said diffusion step with an insulating layer having apertures therethrough to provide exposed areas spanning said region pairs; and performing said diffusion step in an oxidizing atmosphere and at a temperature and for a time wherein said insulating layer is substantially unaffected and a gate oxide layer is formed between said region pairs in said apertures.

* * * * *